(12) United States Patent
Jang et al.

(10) Patent No.: US 9,609,742 B2
(45) Date of Patent: Mar. 28, 2017

(54) ELECTRICAL CHARACTERISTICS OF PACKAGE SUBSTRATES AND SEMICONDUCTOR PACKAGES INCLUDING THE SAME

(71) Applicant: SK hynix Inc., Icheon-si, Gyeonggi-do (KR)

(72) Inventors: Eul Chul Jang, Icheon-si (KR); Qwan Ho Chung, Seoul (KR); Sang Joon Lim, Icheon-si (KR); Sung Woo Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 11 days.

(21) Appl. No.: 14/014,652

(22) Filed: Aug. 30, 2013

(65) Prior Publication Data
US 2014/0175680 A1 Jun. 26, 2014

(30) Foreign Application Priority Data

Dec. 21, 2012 (KR) ........................ 10-2012-0151423

(51) Int. Cl.
| | |
|---|---|
| *H01L 23/48* | (2006.01) |
| *H01L 23/52* | (2006.01) |
| *H01L 29/40* | (2006.01) |
| *H05K 1/02* | (2006.01) |
| *H01L 23/498* | (2006.01) |
| *H01L 23/552* | (2006.01) |

(52) U.S. Cl.
CPC ..... *H05K 1/0224* (2013.01); *H01L 23/49838* (2013.01); *H01L 23/552* (2013.01); *H05K 1/0253* (2013.01); *H01L 2924/0002* (2013.01); *H05K 1/0219* (2013.01); *H05K 2201/093* (2013.01); *H05K 2201/097* (2013.01); *H05K 2201/09236* (2013.01); *H05K 2201/09345* (2013.01); *H05K 2201/09681* (2013.01); *H05K 2201/09727* (2013.01)

(58) Field of Classification Search
CPC ....... H01L 2924/14; H01L 2924/01079; H01L 2924/01029; H01L 2924/3011; H01L 2924/01078; H01L 2224/48091; H01L 23/10; H01L 23/4006
USPC ....... 257/786, 673, 691, 730, 731, 773, 784, 257/733
See application file for complete search history.

(56) References Cited

U.S. PATENT DOCUMENTS 6,160,705 A * 12/2000 Stearns et al. ................ 361/704
6,566,167 B1   5/2003 Liew et al.
(Continued)

FOREIGN PATENT DOCUMENTS

KR    1020100084379 A    7/2010

*Primary Examiner* — Kimberly Rizkallah
*Assistant Examiner* — Dilinh Nguyen
(74) *Attorney, Agent, or Firm* — William Park & Associates Ltd.

(57) ABSTRACT

Package substrates are provided. The package substrate may include a power line and a ground line on a first surface of a substrate body; a plurality of signal lines on the first surface between the power line and the ground line; and a lower ground pattern and a lower power pattern positioned on a second surface of the substrate body opposite to the first surface. The lower ground pattern may be disposed to be opposite to the power line and the lower power pattern may be disposed to be opposite to the ground line. Related semiconductor packages are also provided.

8 Claims, 12 Drawing Sheets

(56) References Cited

U.S. PATENT DOCUMENTS

2002/0076919 A1* 6/2002 Peters ............... H01L 23/49822
                                                        438/637
2012/0200303 A1* 8/2012 Guo et al. .................... 324/613

* cited by examiner

… (US 9,609,742 B2)

ELECTRICAL CHARACTERISTICS OF PACKAGE SUBSTRATES AND SEMICONDUCTOR PACKAGES INCLUDING THE SAME

CROSS-REFERENCE TO RELATED APPLICATION

The present application claims priority under 35 U.S.C 119(a) to Korean Application No. 10-2012-0151423, filed on Dec. 21, 2012, in the Korean intellectual property Office, which is incorporated herein by reference in its entirety as set forth in full.

BACKGROUND

Embodiments of the present disclosure relate to improving electrical characteristics of package substrates and semiconductor packages including the same.

In general, a semiconductor package includes a package substrate and a semiconductor chip mounted on the package substrate. The semiconductor chip may be electrically connected to the semiconductor package through bonding wires. In addition, a power supply voltage and/or electrical signals may be transmitted through the bonding wires. Further, the package substrate may include a power supply line, a ground line, and signal lines. The package substrate and the semiconductor chip may communicate with an external device through the power supply line, the ground line, and the signal lines.

Recently, semiconductor packages have become smaller, thinner, and faster. As a result, the semiconductor packages may suffer from severe electrical interference between the power supply line, the ground line, and the signal lines. The electrical interference between the signal lines may cause a signal transmission delay and/or electrical signal noises. Thus, various design schemes and structures of the semiconductor packages have been continuously developed to solve the problems that may be associated with electrical interference.

SUMMARY

Various embodiments are directed to package substrates and semiconductor packages including the same.

According to some embodiments, a package substrate may include: a power line and a ground line on a first surface of a substrate body; a plurality of signal lines on the first surface between the power line and the ground line; and a lower ground pattern and a lower power pattern positioned on a second surface of the substrate body opposite to the first surface. The lower ground pattern may be disposed to be opposite to the power line and the lower power pattern may be disposed to be opposite to the ground line.

According to further embodiments, a semiconductor package may include a semiconductor chip that may be mounted on a package substrate. The package substrate may include a power line and a ground line disposed on a first surface of a substrate body and may be electrically connected to the semiconductor chip. The package substrate may also include a lower ground pattern and a lower power pattern configured on a second surface of the substrate body opposite to the first surface. The lower ground pattern may be disposed to be opposite to the power line and the lower power pattern may be disposed to be opposite to the ground line.

According to further embodiments, a semiconductor package may include a power line and a ground line that may be disposed on a first surface of the semiconductor package to prevent noise from occurring between a plurality of signal lines that may be disposed on the first surface. The semiconductor package may also include a lower ground pattern and a lower power pattern disposed on a second surface of the semiconductor package. The lower ground pattern may be disposed under the power line, and the lower power pattern may be disposed under the ground line.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Figure 1:
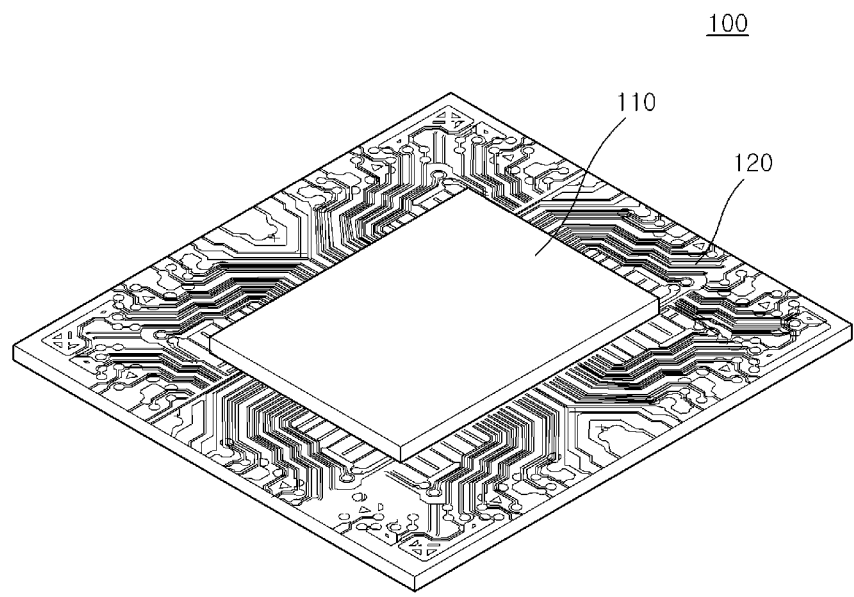
FIG. 1 is a schematic perspective view illustrating a semiconductor package according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and fully convey the scope of the inventive concept to those skilled in the art. In the drawing figures, the dimensions of layers and regions may be exaggerated for clarity of illustration.

It will be understood that when an element is referred to as being "on", "above", "below," or "under" another element, it can be directly "on", "above", "below", or "under" the other element, respectively, or intervening elements may also be present.

Spatially relative terms, such as "beneath", "below," "lower", "above", "upper", "top", "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the package substrate or the semiconductor chip in the figures is turned over, elements described as below and/or beneath other elements or features would then be oriented above the other elements or features. In the drawings, the same reference numerals or the same reference designators denote substantially the same elements.

As used herein, the singular terms "a", "an" and "the" are intended to include the plural forms as well, unless the context clearly indicates otherwise. It will be further understood that the terms "comprise", "comprising", "includes", "including", "have", "having" and variants thereof specify the presence of stated features, integers, steps, operations, elements, and/or components. However, these terms do not preclude the presence and/or addition of one or more other features, integers, steps, operations, elements, components, and/or groups thereof.

Moreover, in method embodiments such as fabrication method embodiments, process steps of the methods may be performed in different sequences from the order which is described in the specification unless the context clearly indicates otherwise. That is, the process steps of the methods may be performed in the same sequence as described in the specification or in an opposite sequence thereto. Alternatively, some of the process steps of the methods may be simultaneously performed.

FIG. 1 is a schematic perspective view illustrating a semiconductor package according to an embodiment.

Referring to FIG. 1, a semiconductor package 100 may include a semiconductor chip 110 mounted on a package substrate 120. In such a case, the semiconductor chip 110 may be mounted on a region of a first surface of the package substrate 120. The package substrate 120 may include upper conductive lines disposed on the first surface thereof. The upper conductive lines may include power lines, ground lines, signal lines, upper power patterns, and upper ground patterns. The power lines, the ground lines, and the signal lines may be electrically connected to the semiconductor chip 110 through connection members such as bonding wires, bumps, or the like. The package substrate 120 may also include lower conductive lines disposed on an opposite surface to the first surface. The lower conductive lines may include lower power patterns and lower ground patterns. The power lines may electrically connect the upper power patterns to the lower power patterns, and the ground lines may electrically connect the upper ground patterns to the lower ground patterns.

Figure 2A:
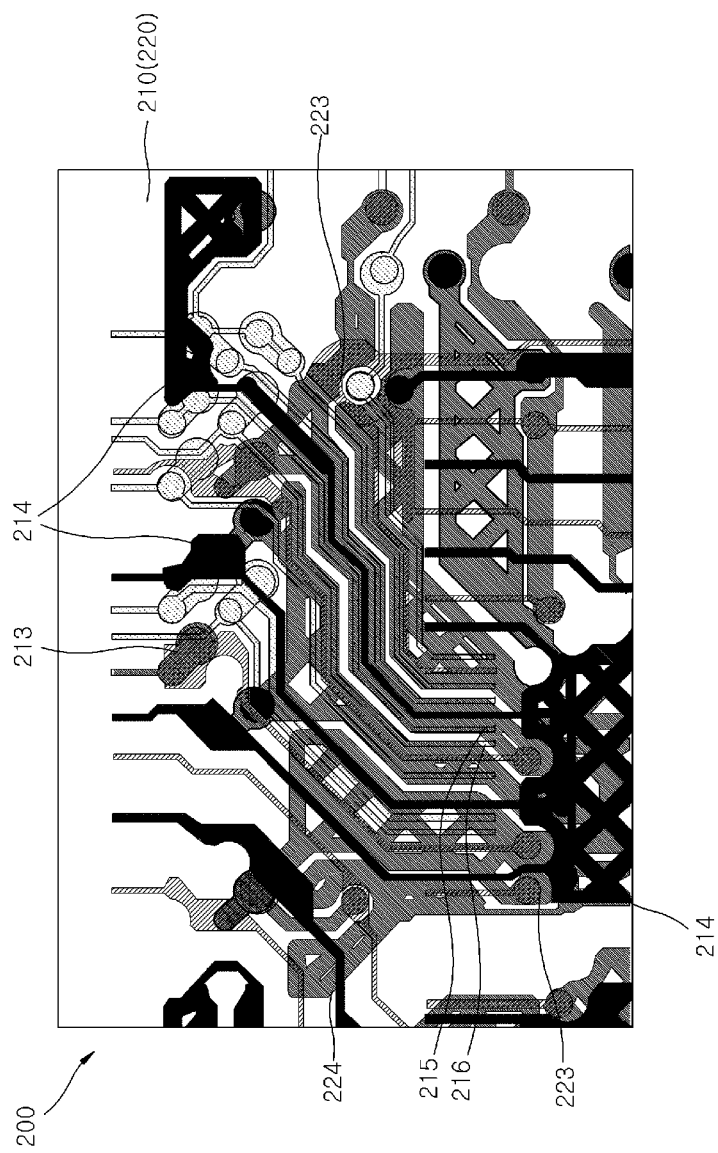
FIG. 2A is a plan view illustrating a portion of a package substrate included in the semiconductor package of FIG. 1.
Figure 2B:
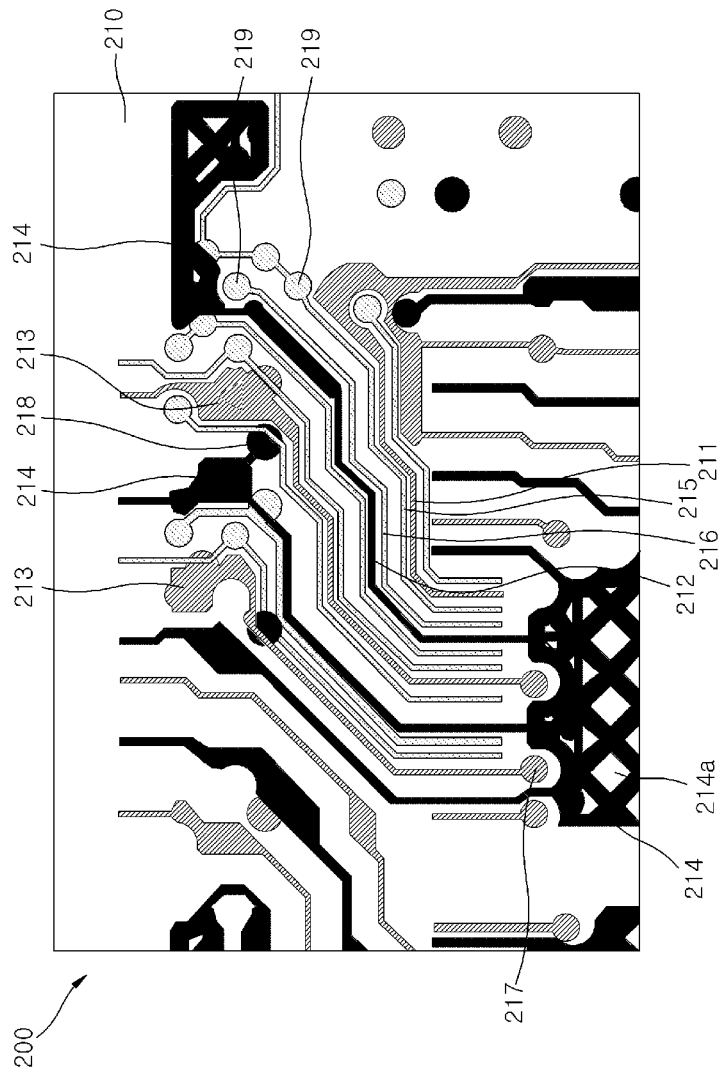
FIG. 2B is a plan view illustrating a first surface of a portion of the package substrate shown in FIG. 2A.
Figure 2C:
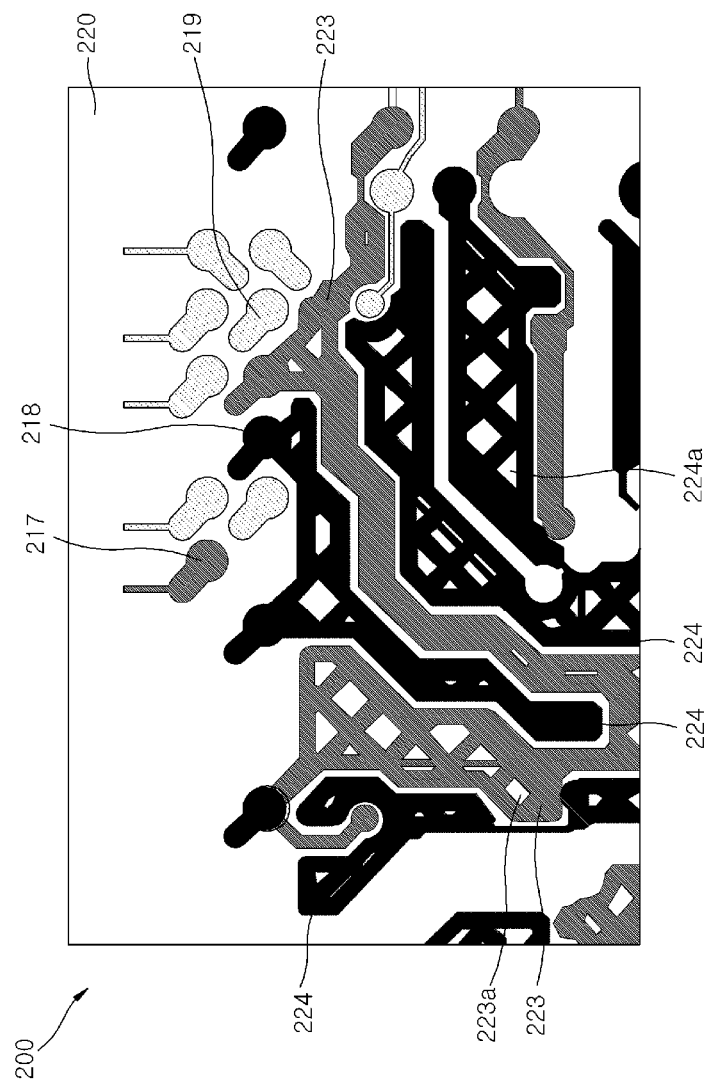
FIG. 2C is a plan view illustrating a second surface of a portion of the package substrate shown in FIG. 2A.

FIG. 2A is a plan view illustrating a portion of a package substrate included in the semiconductor package of FIG. 1. FIG. 2B is a plan view illustrating a first surface of a portion of the package substrate shown in FIG. 2A. FIG. 2C is a plan view illustrating a second surface of a portion of the package substrate shown in FIG. 2A. Referring to FIGS. 2A and 2B, as illustrated, a package substrate 200 may include a first surface 210 and a second surface 220 which is opposite to the first surface 210. Power lines 211 and ground lines 212 may be disposed on the first surface 210 of the package substrate 200. Each of the power lines 211 and the ground lines 212 may be a line-shaped pattern having a uniform width in specific region. The power lines 211 and the ground lines 212 may be alternately arrayed on the first surface 210 of the package substrate 200. Signal lines 215 and 216 may be disposed between the power lines 211 and the ground lines 212 on the first surface. Although FIGS. 2A and 2B illustrate only a pair of signal lines 215 and 216, the inventive concept is not limited thereto. For example, in some embodiments, the package substrate 200 may include three or more signal lines. The signal lines 215 and 216 may be shielded from noises of a neighboring signal line by the power lines 211 or the ground lines 212 positioned adjacent thereto. A signal line via 219 may be disposed to be connected with each of the signal lines 215 and 216. The signal line via 219 may extend toward the second surface 220 and may electrically connect the signal lines 215 and 216 on the first surface 210 to signal lines on the second surface 220.

An upper power pattern 213 may be disposed on at least one end of both ends of each of the power lines 211. The upper power patterns 213 may be electrically connected to one of the lower power patterns 223, which may be disposed on the second surface 220, through a power line via 217. The electric power may be supplied to the power lines 211 through the upper power pattern 213. The upper power pattern 213 may have a non-uniform width as compared with the power lines 211. The upper power pattern 213 may have a nonspecific shape and may occupy a portion of the first surface 210. An upper ground pattern 214 may be disposed on at least one end of both ends of each of the ground lines 212. The upper ground patterns 214 may be electrically connected to one of lower ground patterns 224, which may be disposed on the second surface 220, through a ground line via 218. The upper ground patterns 214 may be grounded. The upper ground patterns 214 may have a non-uniform width as compared with the ground lines 212. The upper ground patterns 214 may have a nonspecific shape and may occupy a portion of the first surface 210. In some embodiments, at least one of the upper ground patterns 214 may be a grid-shaped pattern 214a in a plan view. In some embodiments, all of the upper ground patterns 214 may have the grid-shaped pattern 214a. In some embodiments, none of the upper ground patterns 214 may have the grid-shaped pattern 214a.

In some embodiments, at least one of the upper power patterns 213 may be a grid-shaped pattern in a plan view. That is, at least one of the upper power patterns 213 may have substantially the same configuration as the grid-shaped pattern 214a in a plan view. In some embodiments, all of the upper power patterns 213 may have the grid-shaped pattern.

In some embodiments, one of the upper power patterns 213 may electrically connect one end of one of the power lines 211 to one end of another one of the power lines 211. Similarly, one of the upper ground patterns 214 may electrically connect one end of one of the ground lines 212 to one end of another one of the ground lines 212.

In some embodiments, at least one of the power lines 211 may include a plurality of sub power lines. In such a case, each of the sub power lines may be a line-shaped pattern having a uniform width. In other example, each of the sub power lines may be a line-shaped pattern having a different width.

Referring to FIGS. 2A and 2C, the lower power patterns 223 and the lower ground patterns 224 may be disposed on the second surface 220 of the package substrate 200 as described above. As illustrated, the lower power patterns 223 and the lower ground patterns 224 may be alternately arrayed. For example, one of the lower ground patterns 224 may be disposed between two of the lower power patterns 223. One of the lower power patterns 223 may be disposed between two of the lower ground patterns 224. Each of the lower power patterns 223 and the lower ground patterns 224 may have a nonspecific shape and may occupy a portion of the second surface 220.

In some embodiments, at least one of the lower power patterns 223 may be a grid-shaped pattern 223a in a plan view. In some embodiments, all of the lower power patterns 223 may have the grid-shaped pattern 223a. In some embodiments, none of the lower power patterns 223 have the grid-shaped pattern 223a.

In some embodiments, at least one of the lower ground patterns 224 may be a grid-shaped pattern 224a in a plan view. In some embodiments, all of the lower ground patterns 224 may have the grid-shaped pattern 224a. In some embodiments, none of the lower ground patterns 224 may have the grid-shaped pattern 224a.

The power line vias 217, the ground line vias 218, and the signal line vias 219 extending from the first surface 210 may be disposed on the second surface 220. The power line vias 217 may be electrically connected to the lower power patterns 223, and the ground line vias 218 may be electrically connected to the lower ground patterns 224. The signal lines 215 and 216 disposed on the first surface 210 may be electrically connected to other signal lines formed on the second surface 220 through the signal line vias 219.

Referring again to FIG. 2A, the lower ground patterns 224 on the second surface 220 may be located to be opposite to the power lines 211 (shown in FIG. 2B) on the first surface 210. The lower power patterns 223 on the second surface 220 may be located to be opposite to the ground lines 212 on the first surface 210. In some embodiments, the lower ground patterns 224 may have a width which is greater than the power lines 211 on the first surface 210. The lower ground patterns 224 may be disposed on the second surface 220 to overlap with the power lines 211 on the first surface 210 when viewed from a plan view. In some embodiments, the lower power patterns 223 may have a width which is greater than that of the ground lines 212 on the first surface 210. The lower power patterns 223 may be disposed on the second surface 220 to overlap with the ground lines 212 on the first surface 210 when viewed from a plan view.

Hereinafter, a configuration of the package substrate including the power lines 211, the lower ground patterns 224, the ground lines 212, and the lower power patterns 223 will be described with reference to a cross sectional view.

Figure 3:
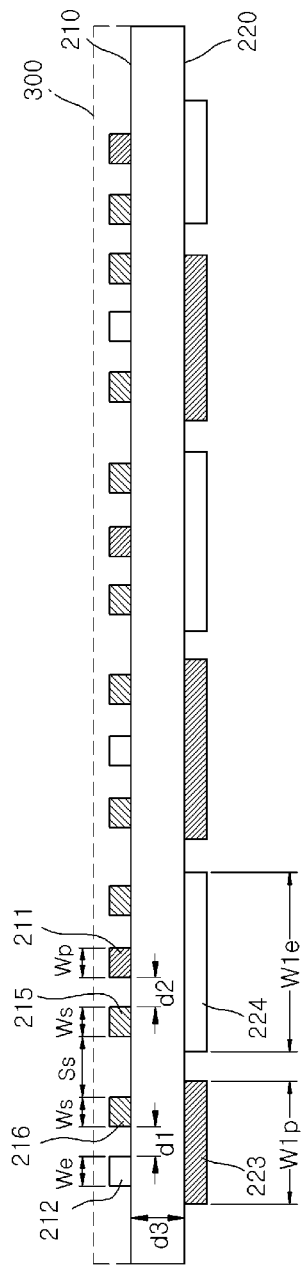
FIG. 3 is a schematic cross sectional view illustrating a semiconductor package according to an embodiment.

FIG. 3 is a schematic cross sectional view illustrating a semiconductor package according to an embodiment. Specifically, FIG. 3 is a cross sectional view illustrating the power lines 211, the ground lines 212, and the signal lines 215 and 216 disposed on the first surface 210; and the lower power patterns 223 and the lower ground patterns 224 disposed on the second surface 220. Referring to FIG. 3, the lower power patterns 223 on the second surface 220 may be located to face the ground lines 212 on the first surface 210, and a width (W1p) of the lower power patterns 223 may be greater than a width (We) of the ground lines 212. That is, the lower power patterns 223 may fully cover the ground lines 212 in a plan view. When the lower power patterns 223 are vertically projected onto the first surface 210, the ground lines 212 may overlap with at least a portion of the projected lower power patterns 223. For example, an overlap area between the lower power patterns 223 and the ground lines 212 may be greater than 70% of a total planar area of the ground lines 212. In particular embodiments, an overlap area between the lower power patterns 223 and the ground lines 212 may be greater than 90% of a total planar area of the ground lines 212.

The lower ground patterns 224 on the second surface 220 may be located to face the power lines 211 on the first surface 210, and a width (W1e) of the lower ground patterns 224 may be greater than a width (Wp) of the power lines 211. That is, the lower ground patterns 224 may fully cover the power lines 211 in a plan view. When the lower ground patterns 224 are vertically projected onto the first surface 210, the power lines 211 may overlap with at least a portion of the projected lower ground patterns 224. For example, an overlap area between the lower ground patterns 224 and the power lines 211 may be greater than 70% of a total planar area of the power lines 211. In particular embodiments, an overlap area between the lower ground patterns 224 and the power lines 211 may be greater than 90% of a total planar area of the power lines 211.

The signal lines 215 and 216 may be disposed between one of the power lines 211 and one of the ground lines 212. As illustrated, when the pair of signal lines 215 and 216 are disposed between the power lines 211 and the ground lines 212, the pair of signal lines 215 and 216 may have the same width (Ws). Further, the signal lines 215 and 216 may be spaced apart from each other by a predetermined distance (Ss) to minimize the signal interference therebetween. The signal lines 215 and 216 may be shielded from noise signals of the neighboring signal lines by the power lines 211 or the ground lines 212 adjacent thereto.

The lower power patterns 223 may be electrically connected to the power lines 211 through the power line vias 217 illustrated in FIGS. 2B and 2C. The lower ground patterns 224 may be electrically connected to the ground lines 212 through the ground line vias 218 illustrated in FIG. 2B. Electrical characteristics of the package substrate 200 may significantly improve when both the lower power patterns 223 and the lower ground patterns 224 are disposed on the second surface 220 than when only the lower ground patterns 224 are only disposed on the second surface 220. Improvement of the electrical characteristics of the package substrate may mean a reduction of an inductance level and a resistance level of the power lines 211; and an increase of a coupling capacitance between the power lines 211 and the ground lines 212. Further, the improvement of the electrical characteristics of the package substrate 200 may mean a reduction of an inductance of the signal lines 215 and 216.

The package substrate according to the present embodiment may reduce signal impedance. In general, the signal impedance Z may be expressed by the following equation.

$$Z=R+(1/j\omega C)+j\omega L\ (\omega=2\pi f)$$

where, "R" denotes a resistance, "C" denotes a capacitance, "L" denotes an inductance, and "f" denotes a frequency.

When a frequency f at which a circuit operates increases, an angular frequency "ω" may also increase. In such a case, if the power lines 211 and the ground lines 212 are alternately and repeatedly disposed and an insulation layer 300 such as a solder resist layer is disposed between the power lines 211 and the ground lines 212, the capacitance C between the power lines 211 and the ground lines 212 may be increased due to a potential difference between the power lines 211 and the ground lines 212. Thus, a conductance component "1/jωC" may reduce to lower a total impedance Z. Further, the lower power patterns 223 may be disposed on the second surface 220 of the package substrate in a plurality of segments to reduce the inductance L. This may reduce an inductance component "jωL" to decrease the total impedance Z.

In addition, the package substrate according to the present embodiment may reduce coupling noises. That is, since the power lines 211 and the ground lines 212 are disposed to be adjacent to the signal lines 215 and 216, electromagnetic fields generated around the signal lines 215 and 216 may be shielded by the power lines 211 and the ground lines 212 not to reach the neighbor signal lines when data signals are transmitted through the signal lines 215 and 216. Thus, coupling noises between the adjacent signal lines 215 and 216 may be reduced. Ideally, each of the signal lines may be disposed between two of the power lines and the ground lines to more efficiently shield all the signal lines and to minimize interference between the signal lines. However, in such a case, there may be some limitations in reducing a size of the package substrate. However, according to the present embodiment, two of the parallel signal lines 215 and 216 may be disposed between two among the power lines 211 and the ground lines 212. Thus, the package substrate according to the present embodiment may provide an optimized solution in terms of both the size and the noise.

In FIG. 3, two adjacent signal lines 215 and 216 may be spaced apart from each other by a distance Ss which is 1.5 times to twice a first distance D1 between the signal line 216 and the ground line 212, thereby remarkably reducing electrical signal interference between the adjacent signal lines 215 and 216. Similarly, the distance Ss between the adjacent signal lines 215 and 216 may be 1.5 times to twice a second distance D2 between the signal line 215 and the power line 211. In some embodiments, the distance Ss between the adjacent signal lines 215 and 216 may be set by a different reference. That is, when a width of the signal lines 215 and 216 is greater than a height (i.e., a thickness) thereof, the shielding effect or the convergence effect of the electromagnetic fields generated from the signal lines 215 and 216 may be dominantly affected by the lower power lines 223 or the lower ground lines 224 overlapping with the signal lines 215 and 216 rather than by the power lines 211 or the ground lines 212. This may be because a coupling capacitance between the signal lines 215 and 216 and the lower power pattern 223 (or the lower ground pattern 224) is greater than a coupling capacitance between the signal lines 215 and 216 and the power line 211 (or the ground line 212). Thus, in such a case, the adjacent signal lines 215 and 216 may be spaced apart from each other by a distance Ss which is 1.5 times to twice a third distance D3 between the signal lines 215 and 216 and the lower power pattern 223 (or the lower ground pattern 224).

As described above, according to the embodiments, a resistance and an inductance of power lines may be reduced to improve a transmission speed of a power signal on the power lines. Further, a coupling capacitance between the power lines and ground lines may be increased to improve the noise removability on the power lines. Furthermore, an inductance of signal lines may be reduced to improve a signal transmission speed.

More specific embodiments, that is, some experimental examples will be described hereinafter to fully and clearly show the configurations of the inventive concept.

EXAMPLES

Some simulations were executed to evaluate electrical characteristics of package substrates according to some embodiments and some comparative examples. The electrical characteristics of the package substrates were calculated according to dispositions and shapes of power lines, ground lines, power patterns and ground patterns.

FIGS. 4A to 4D are cross sectional views illustrating package substrates used in the simulations for evaluating the electrical characteristics of the package substrates according to some embodiments and some comparative examples. Each of the package substrates may be fabricated to have a planar area of 12 millimeters×12 millimeters, and the reference character "W" in the drawings may correspond to 35 micrometers.

Figure 4A:
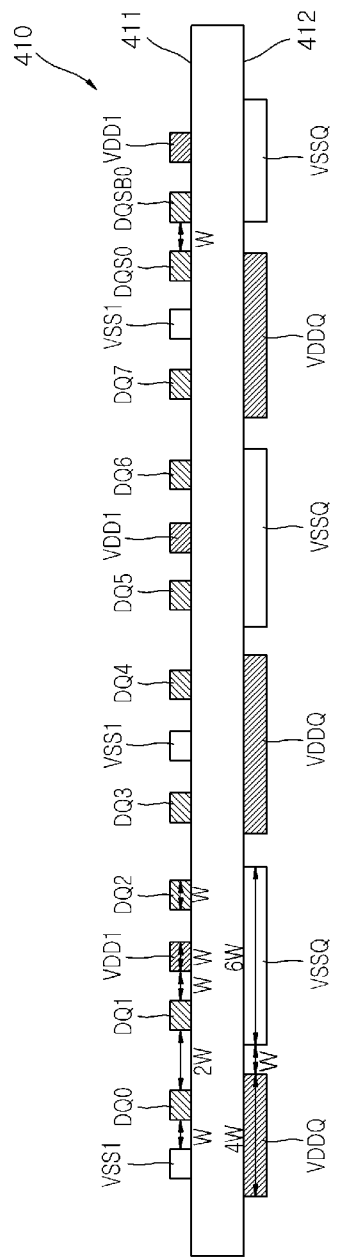
FIGS. 4A to 4D are cross sectional views illustrating package substrates used in simulation of electrical characteristics of the package substrates according to some embodiments and some comparative examples of the present invention.

FIG. 4A illustrates a package substrate 410 used in a simulation of a first embodiment. Referring to FIG. 4A, signal lines DQ0, DQ1, DQ2, DQ3, DQ4, DQ5, DQ6, DQ7, DQS0 and DQSB0 are disposed on a first surface 411 of the package substrate 410. Each of the signal lines DQ0, DQ1, DQ2, DQ3, DQ4, DQ5, DQ6, DQ7, DQS0 and DQSB0 has a line width (W). As illustrated in FIG. 4A, the signal lines DQ0 and DQ1, DQ2 and DQ3, DQ4 and DQ5, DQ6 and DQ7, and DQS0 and DQSB0 are disposed between one of power lines VDD1 and one of ground lines VSS1. While the adjacent signal lines DQS0 and DQSB0 disposed between one of the power lines VDD1 and one of the ground lines VSS1 are spaced apart from each other by a distance of 'W'; the other adjacent signal lines (DQ0 and DQ1, DQ2 and DQ3, DQ4 and DQ5, or DQ6 and DQ7) disposed between one of the power lines VDD1 and one of the ground lines VSS1 are spaced apart from each other by a distance of '2W'. Each of the power lines VDD1 and the ground lines VSS1 has a width of 'W'. The signal lines DQ1, DQ2, DQ5, DQ6, and DQSB0 immediately adjacent to the power lines VDD1 are spaced apart from the power lines VDD1 by a distance of 'W'; and the signal lines DQ0, DQ3, DQ4, DQ7 and DQS0 immediately adjacent to the ground lines VSS1 are also spaced apart from the ground lines VSS1 by a distance of 'W'.

Lower power patterns VDDQ and lower ground patterns VSSQ are alternately disposed on a second surface 412 of the package substrate 410. Each of the lower power patterns VDDQ are disposed on the second surface 412 to face at least one of the ground lines VSS1 on the first surface 411 and have a width of '4W', as illustrated. Each of the lower ground patterns VSSQ are disposed on the second surface 412 to face at least one of the power lines VDD1 on the first surface 411 and have a width of '6W', as illustrated. The lower power patterns VDDQ and the lower ground patterns VSSQ are spaced apart from each other by a distance of 'W'.

Figure 4B:
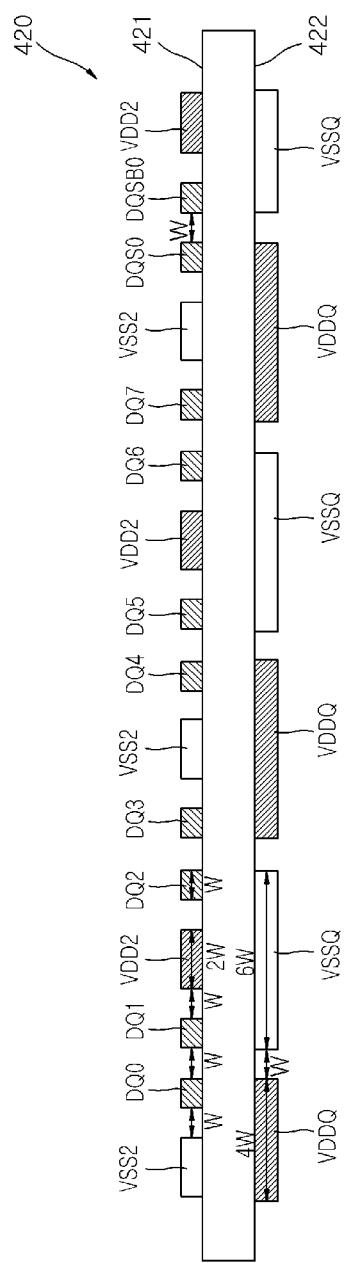

FIG. 4B illustrates a package substrate 420 used in a simulation of a second embodiment. Referring to FIG. 4B, the second embodiment is different from the first embodiment of FIG. 4A in terms of a width of power lines and ground lines. That is, the second embodiment includes power lines VDD2 and ground lines VSS2 disposed on a first surface 421 of a package substrate 420. Each of the power lines VDD2 and the ground lines VSS2 have a width of '2W' while each of the power lines VDD1 and the ground lines VSS1 shown in FIG. 4A has a width of 'W'. The lower power patterns VDDQ and the lower ground patterns VSSQ disposed on a second surface 422 of the package substrate 420 have substantially the same configuration as those illustrated in FIG. 4A.

Figure 4C:
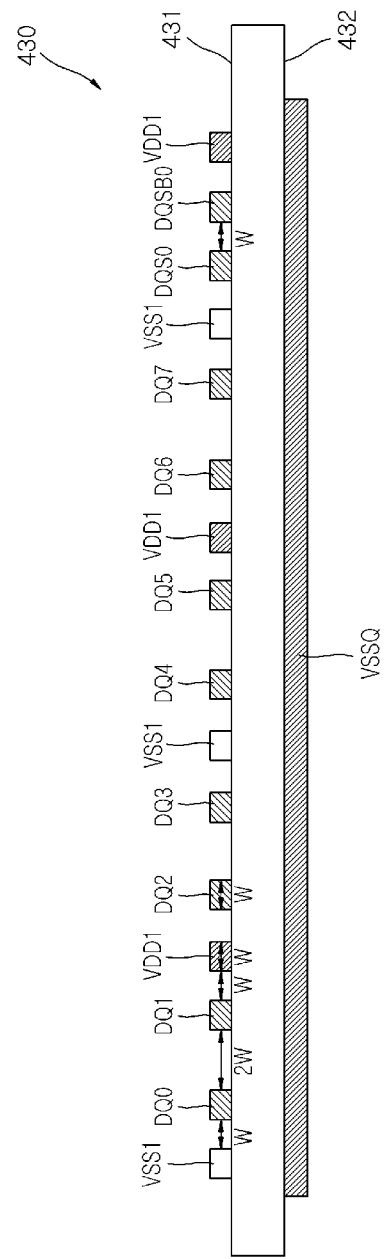

FIG. 4C illustrates a package substrate 430 used in a simulation of a first comparative example. Referring to FIG. 4C, the first comparative example is different from the first embodiment of FIG. 4A in terms of a configuration of a lower ground pattern VSSQ. That is, according to the first comparative example, a package substrate 430 has a first surface 431 and a second surface 432 which are opposite to each other. In addition, only a single lower ground pattern VSSQ is disposed on the second surface 432 of the package substrate 430.

Figure 4D:
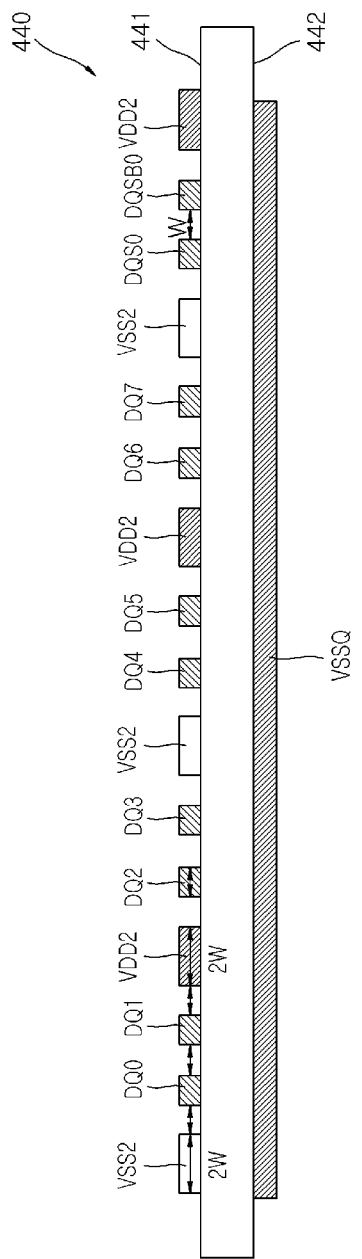

FIG. 4D illustrates a package substrate 440 used in a simulation of a second comparative example. Referring to FIG. 4D, the second comparative example is different from the first comparative example of FIG. 4C in terms of a width of power lines and ground lines. That is, each of the power lines VDD2 and the ground lines VSS2 disposed on a first surface 441 of a package substrate 400 have a width of '2W'. The lower ground patterns VSSQ disposed on a second surface 442 of the package substrate 440 have substantially the same configuration as those illustrated in FIG. 4C.

Resistance, inductance, and capacitance of the various power lines illustrated in FIGS. 4A to 4D may be calculated using a simulation tool 'ANSYS TPA (turbo package analyzer)' produced by the ANSYS incorporation. Further, self-inductance and mutual inductance of the signal lines illustrated in FIGS. 4A to 4D may also be calculated using the simulation tool 'ANSYS TPA' produced by the ANSYS incorporation.

Figure 5A:
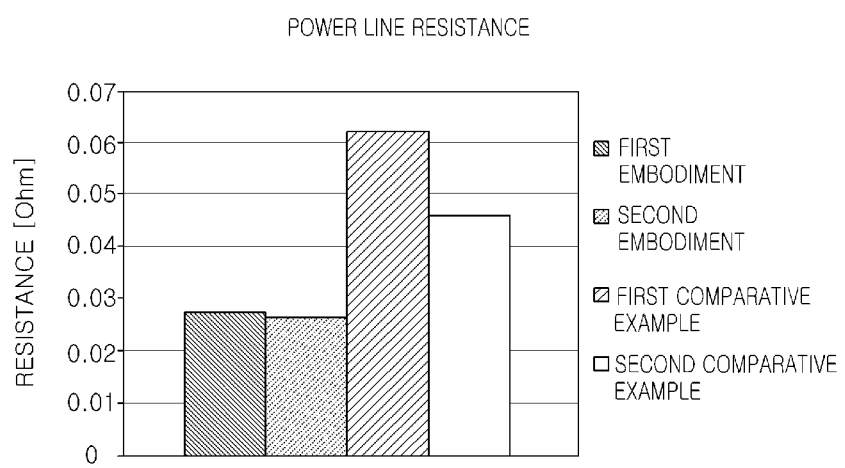
FIGS. 5A to 5E are graphs illustrating simulation results of the package substrates according to some embodiments and some comparative examples of the present invention.

FIGS. 5A to 5E are graphs illustrating the simulation results of the package substrates illustrated in FIGS. 4A to 4D. FIG. 5A is a histogram illustrating simulation results of electrical resistances of the power lines included in the first and second embodiments and the first and second comparative examples. Referring to FIG. 5A, the resistances of the power lines included in the first and second embodiments were lower than the resistances of the power lines included in the first and second comparative examples. Specifically, the resistances of the power lines included in the first and second embodiments were about half of the resistances of the power lines included in the first and second comparative examples.

Figure 5B:
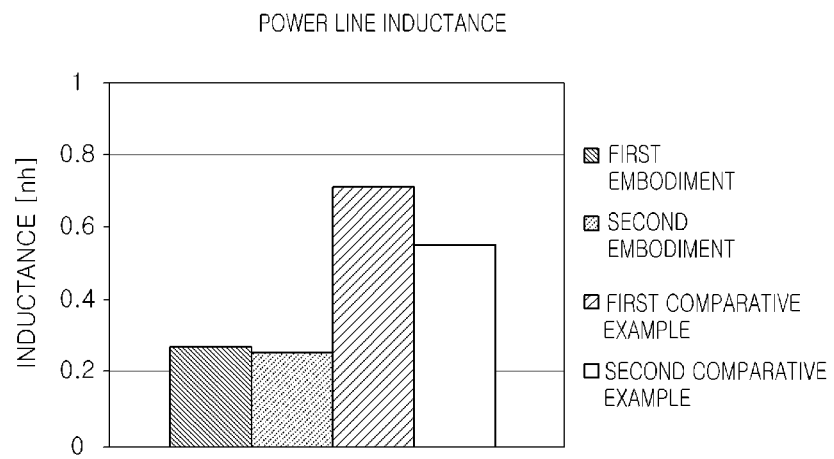

FIG. 5B is a histogram illustrating simulation results of electrical inductances of the power lines included in the first and second embodiments and the first and second comparative examples. Referring to FIG. 5B, the inductances of the power lines included in the first and second embodiments were lower than the inductances of the power lines included in the first and second comparative examples. Specifically, the inductances of the power lines included in the first and second embodiments were about one third of the inductances of the power lines included in the first and second comparative examples.

Figure 5C:
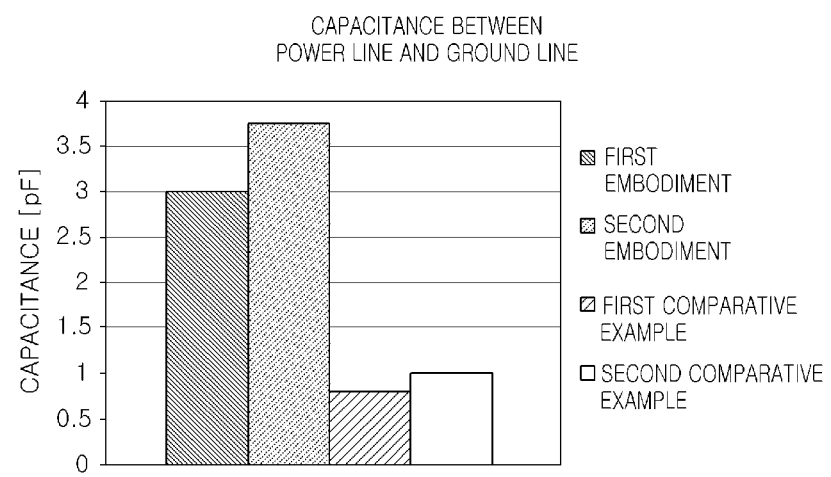

FIG. 5C is a histogram illustrating simulation results of electrical capacitances between the power lines and ground lines included in the first and second embodiments and the first and second comparative examples. Referring to FIG. 5C, the capacitances between the power lines and the ground lines included in the first and second embodiments were higher than the capacitances between the power lines and the ground lines included in the first and second comparative examples. Specifically, the capacitances between the power lines and the ground lines included in the first and second embodiments were about four times the capacitances between the power lines and the ground lines included in the first and second comparative examples.

Figure 5D:
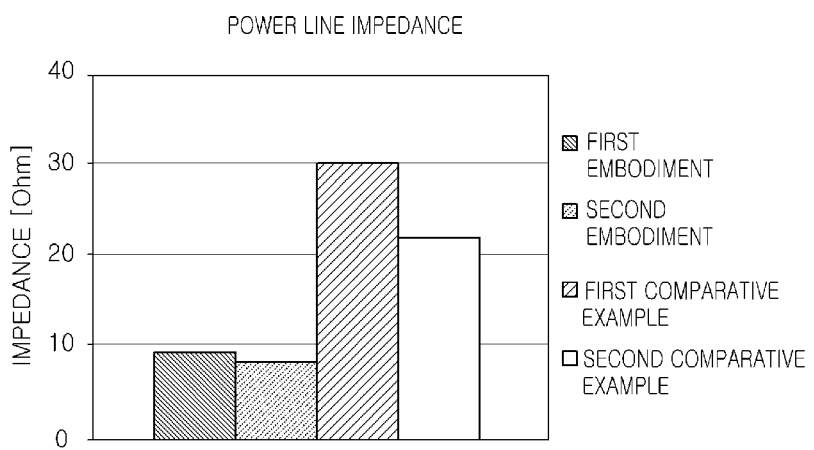

FIG. 5D is a histogram illustrating simulation results of electrical impedances of the power lines included in the first and second embodiments and the first and second comparative examples. The power line impedance includes the resistance component, the inductance component, and the capacitance component of the power lines illustrated in FIGS. 5A, 5B and 5C. As illustrated, the impedances of the power lines included in the first and second embodiments were lower than the impedances of the power lines included in the first and second comparative examples. Specifically, the impedances of the power lines included in the first and second embodiments were about one third of the impedances of the power lines included in the first comparative example.

Figure 5E:
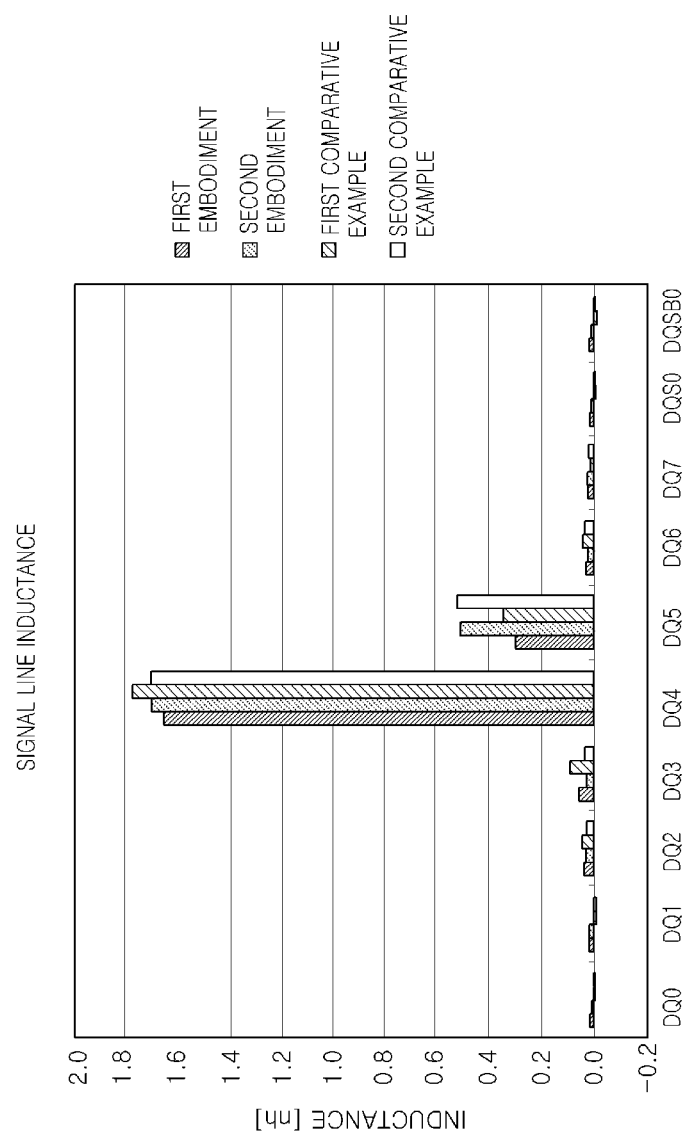

FIG. 5E is a histogram illustrating simulation results of electrical inductances of the signal lines included in the first and second embodiments and the first and second comparative examples. Specifically, self inductances of the signal lines DQ4 included in the first and second embodiments and the first and second comparative examples were primarily calculated using the simulation tool; and mutual inductances of the other signal lines DQ0, DQ1, DQ2, DQ3, DQ5, DQ6, DQ7, DQS0, and DQSB0 were calculated using the simulation tool. The self inductances of the signal lines DQ4 included in the first and second embodiments were lower than the self inductances of the signal lines DQ4 included in the first and second comparative examples. In the simulation results of the mutual inductance, the signal lines DQ5 corresponding to the nearest signal lines to the signal lines DQ4 exhibited relatively high mutual inductance. Further, the mutual inductances of the signal lines DQ5 included in the first embodiment and the first comparative example (having a relatively far distance '2W' between two adjacent signal lines) were lower than the mutual inductances of the signal lines DQ5 included in the second embodiment and the second comparative example (having a relatively close distance 'W' between two adjacent signal lines). The remaining signal lines DQ0, DQ1, DQ2, DQ3, DQ6, DQ7, DQS0, and DQSB0 may be shielded from the signal lines DQ4, and DQ5 by at least one of the power lines VDD and one of the ground lines VSS. As a result, the mutual inductances of the remaining signal lines were even lower than the mutual inductances of the signal lines DQ5.

According to the embodiments set forth above, a ground line on a first surface of a substrate body may be disposed to face a power pattern on a second surface of the substrate body opposite to the first surface; and a power line on the first surface of the substrate body may be disposed to face a ground pattern on the second surface. Thus, an inductance, a resistance, impedance, and a coupling capacitance of one of the conductive lines or patterns on the substrate body may be improved. As a result, high performance semiconductor packages including the package substrate may be realized.

The embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A package substrate comprising:
    a power line and a ground line configured on a first surface of a substrate body;
    two or more signal lines on the first surface between the power line and the ground line; and
    a lower ground pattern and a lower power pattern positioned on a second surface of the substrate body opposite to the first surface,
    wherein the lower ground pattern is overlapped with the power line in a vertical direction, and the lower power pattern is overlapped with the ground line in the vertical direction,
    wherein the lower ground pattern and the lower power pattern are in direct contact with the second surface of the substrate body, and
    wherein the lower ground pattern continuously extends in a horizontal direction so as to cover the power line and one of the two or more signal lines.

2. The package substrate of claim 1, wherein the lower ground pattern is disposed to face the power line and fully overlaps with the power line when viewed from a plan view.

3. The package substrate of claim 1, wherein the lower power pattern is disposed to face the ground line and fully overlaps with the ground line when viewed from a plan view.

4. The package substrate of claim 1, wherein when the lower ground pattern is vertically projected onto the first surface, the projected lower ground pattern overlaps with at least a portion of the power line; and wherein when the lower power pattern is vertically projected onto the first surface, the projected lower power pattern overlaps with at least a portion of the ground line.

5. The package substrate of claim 1, wherein the distance between the signal lines is 1.5 times to twice a first distance between the signal line and the ground line.

6. The package substrate of claim 1, wherein the distance between the signal lines is 1.5 times to twice a second distance between the signal line and the power line.

7. The package substrate of claim 1, wherein the distance between the signal lines is 1.5 times to twice a third distance between the signal line and the lower power pattern.

8. The package substrate of claim 1, wherein the second surface is an exterior surface of the substrate body, and
wherein the lower power pattern continuously extends in the horizontal direction so as to cover the ground line and another of the two or more signal lines.

* * * * *